(12) United States Patent
Yamaguchi

(10) Patent No.: US 6,922,325 B2
(45) Date of Patent: Jul. 26, 2005

(54) ELECTROSTATIC ATTRACTION MECHANISM, SURFACE PROCESSING METHOD AND SURFACE PROCESSING DEVICE

(75) Inventor: Nobuo Yamaguchi, Tokyo (JP)

(73) Assignee: Anelva Corporation, Fuchu (JP)

( * ) Notice: Subject to any disclaimer, the term of this patent is extended or adjusted under 35 U.S.C. 154(b) by 517 days.

(21) Appl. No.: 09/895,403

(22) Filed: Jul. 2, 2001

(65) Prior Publication Data

US 2002/0017694 A1 Feb. 14, 2002

(30) Foreign Application Priority Data

Jul. 6, 2000 (JP) ........................................ 2000-205939

(51) Int. Cl.[7] .............................................. H01T 23/00
(52) U.S. Cl. ...................................... 361/234; 361/233
(58) Field of Search ................................ 361/234, 233, 361/115

(56) References Cited

U.S. PATENT DOCUMENTS 5,646,814 A * 7/1997 Shamouilian et al. ....... 361/234
5,880,924 A * 3/1999 Kumar et al. ................ 361/234
5,958,265 A * 9/1999 Ogahara ................. 219/121.43

FOREIGN PATENT DOCUMENTS

| JP | 63-310965 | 12/1988 |
| JP | 09-087839 | 3/1997 |
| JP | 10-163308 | 6/1998 |
| JP | 11-195260 | 7/1999 |

OTHER PUBLICATIONS

Electrostatic Clamping Applied to Semiconductor Plasma Processing, *J. Electrochem. Soc.*, vol. 140, No. 11, Nov. 1993, The Electrochemical Society, Inc., pp. 3245–3255.

* cited by examiner

*Primary Examiner*—Stephen W. Jackson
(74) *Attorney, Agent, or Firm*—Burns, Doane, Swecker & Mathis, L.L.P.

(57) ABSTRACT

Electrostatic attraction is performed on a plate-shaped object 9 in that an attraction power source 3 applies a voltage to a pair of attraction terminals 23, 24 mounted inside a dielectric block 22, the surface of which is an attraction surface, thereby inducing static electricity in an attraction surface. The attraction power source 3 adjusts the surface potential of a plate-shaped object 9 by independently controlling voltages applied to the respective attraction terminals 23, 24. Processing is carried out on the surface of the plate-shaped object 9 while the injection of charged particles into the plate-shaped object 9 is suppressed. A control part 6 which controls the attraction power source 3 records, in a recording part 62, data obtained by measuring in advance the surface potential of the plate-shaped object 9 while respectively changing the voltage applied to the attraction terminals 23, 24, and controls the attraction power source 3 with a pattern selected in accordance with this data.

21 Claims, 5 Drawing Sheets

[Figure 1]
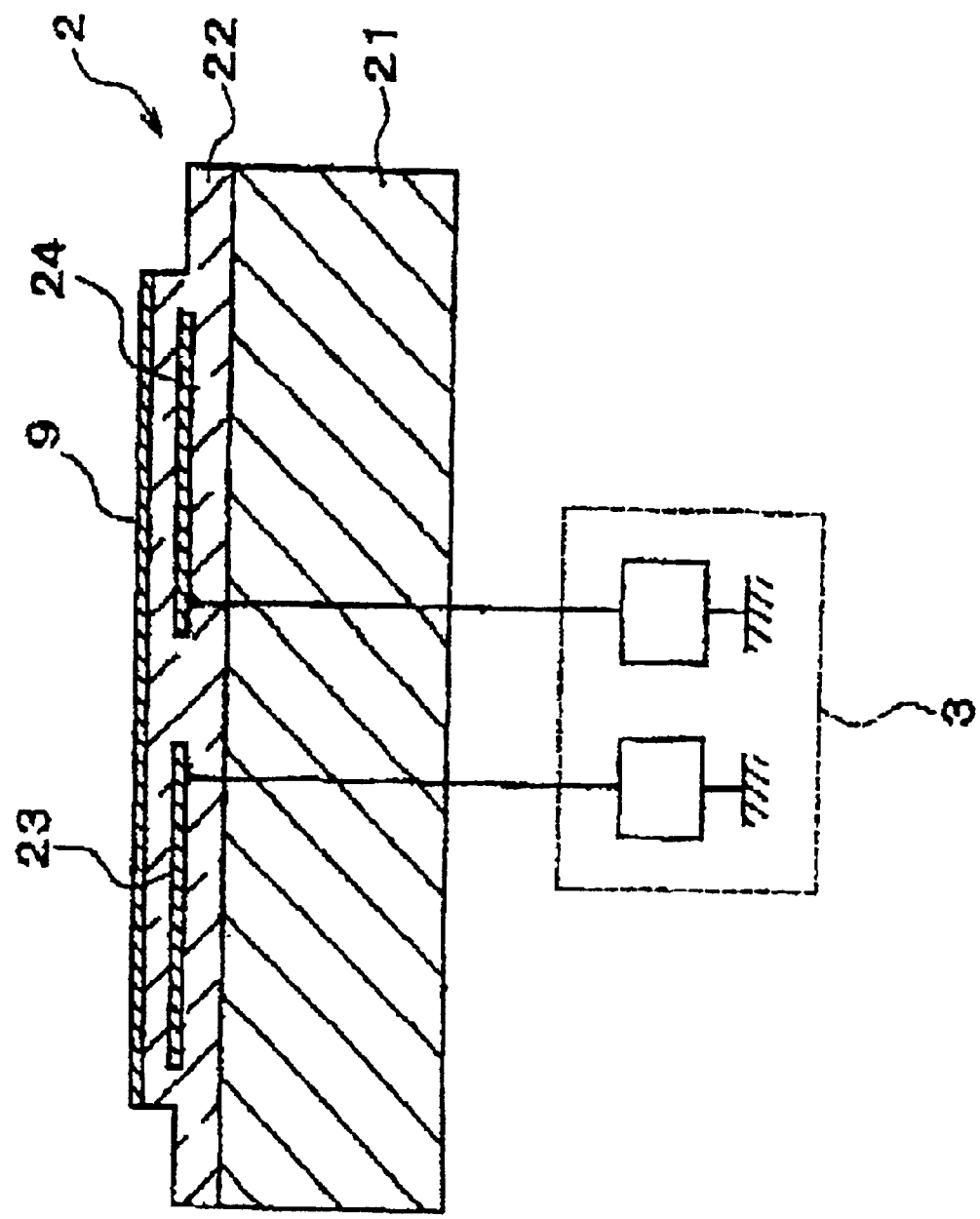

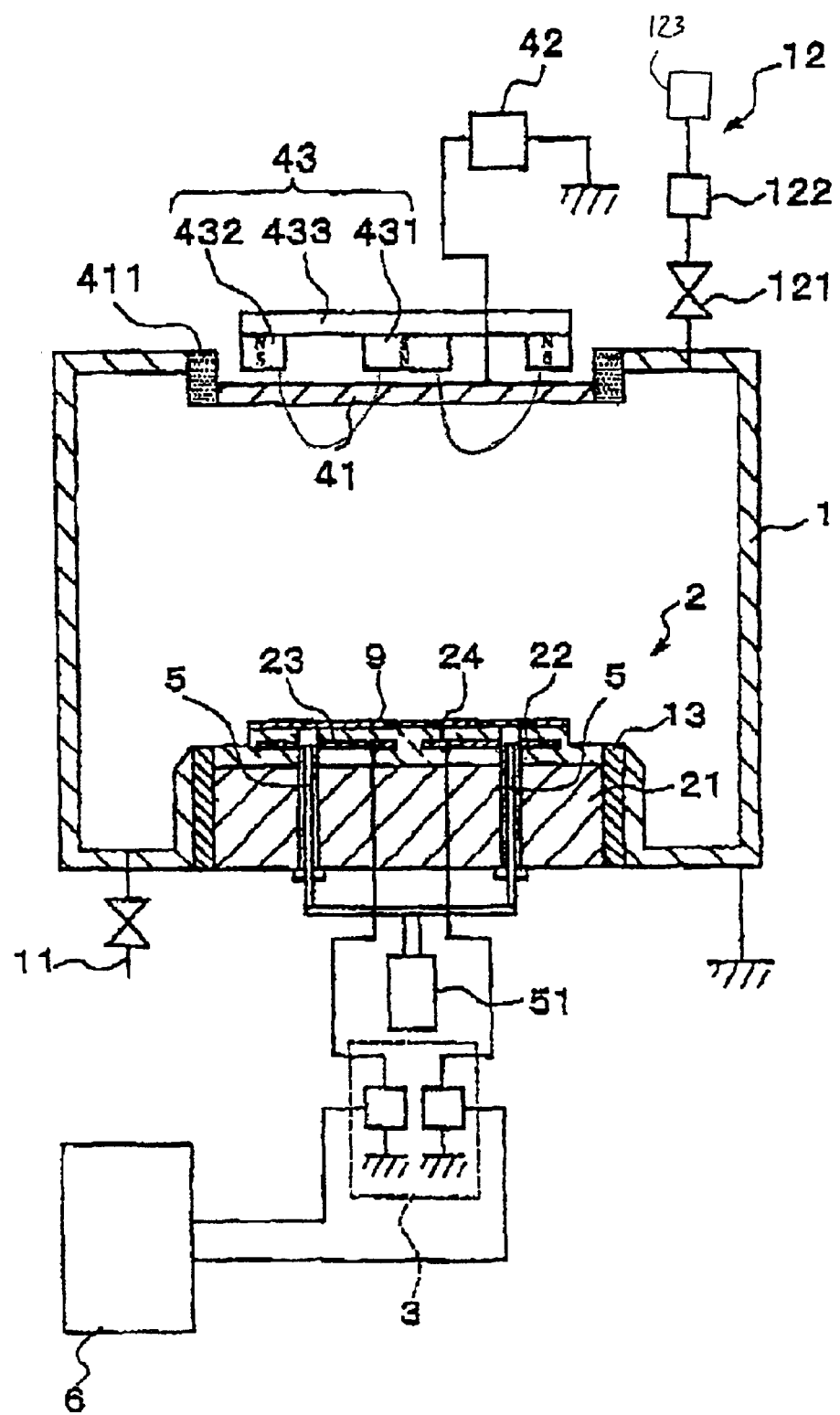
[Figure 2]

[Figure 3]
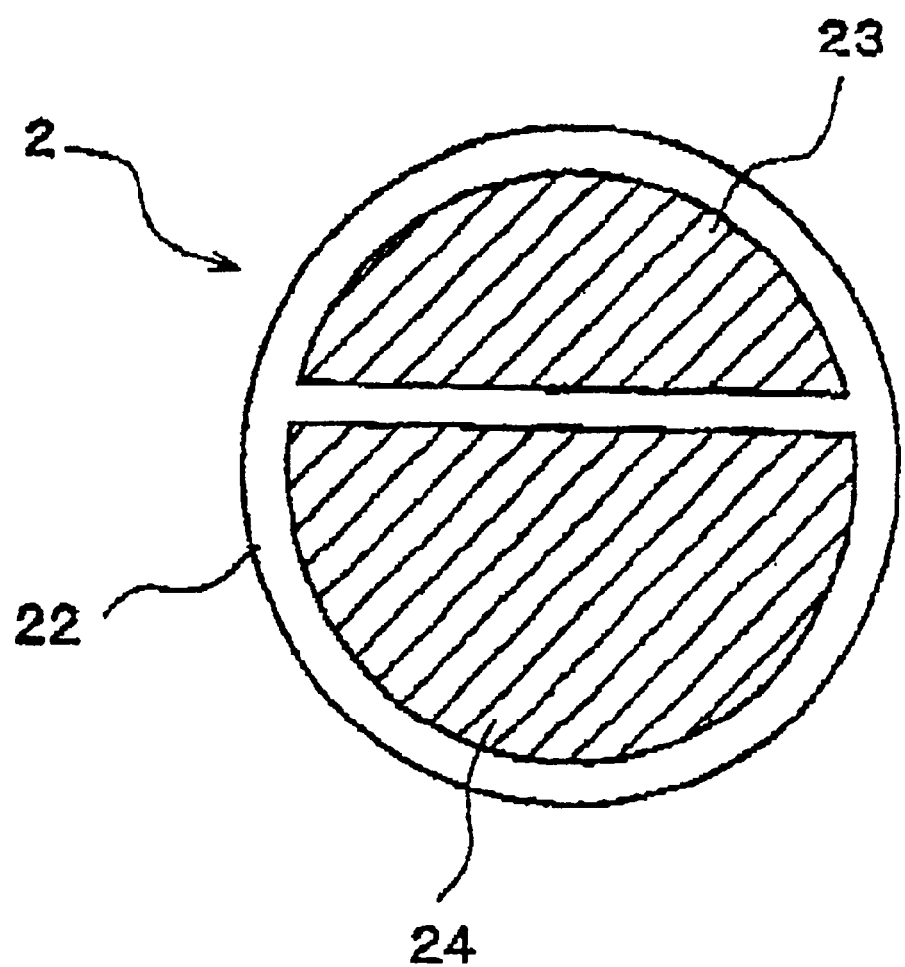

[Figure 4]
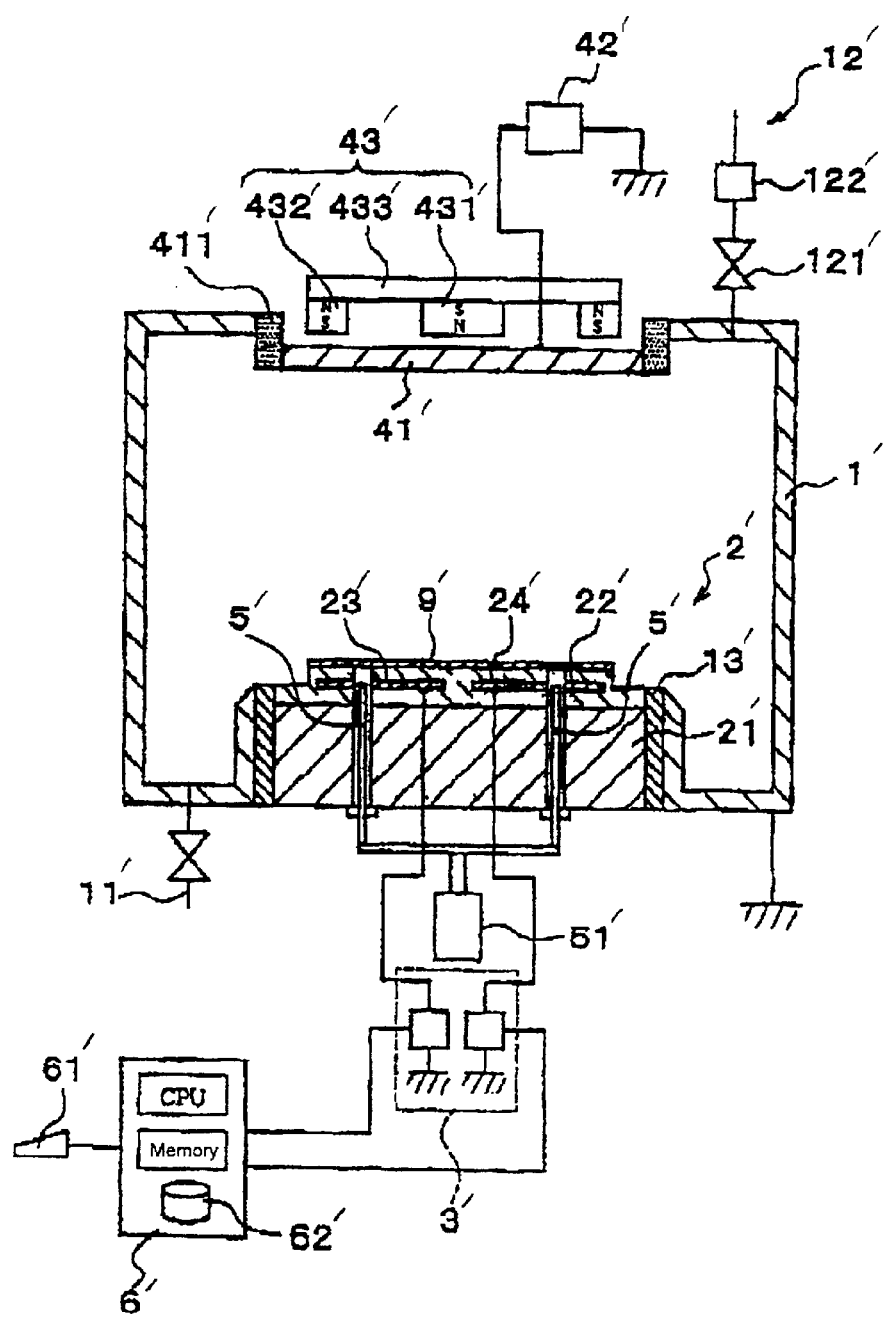

[Figure 5]
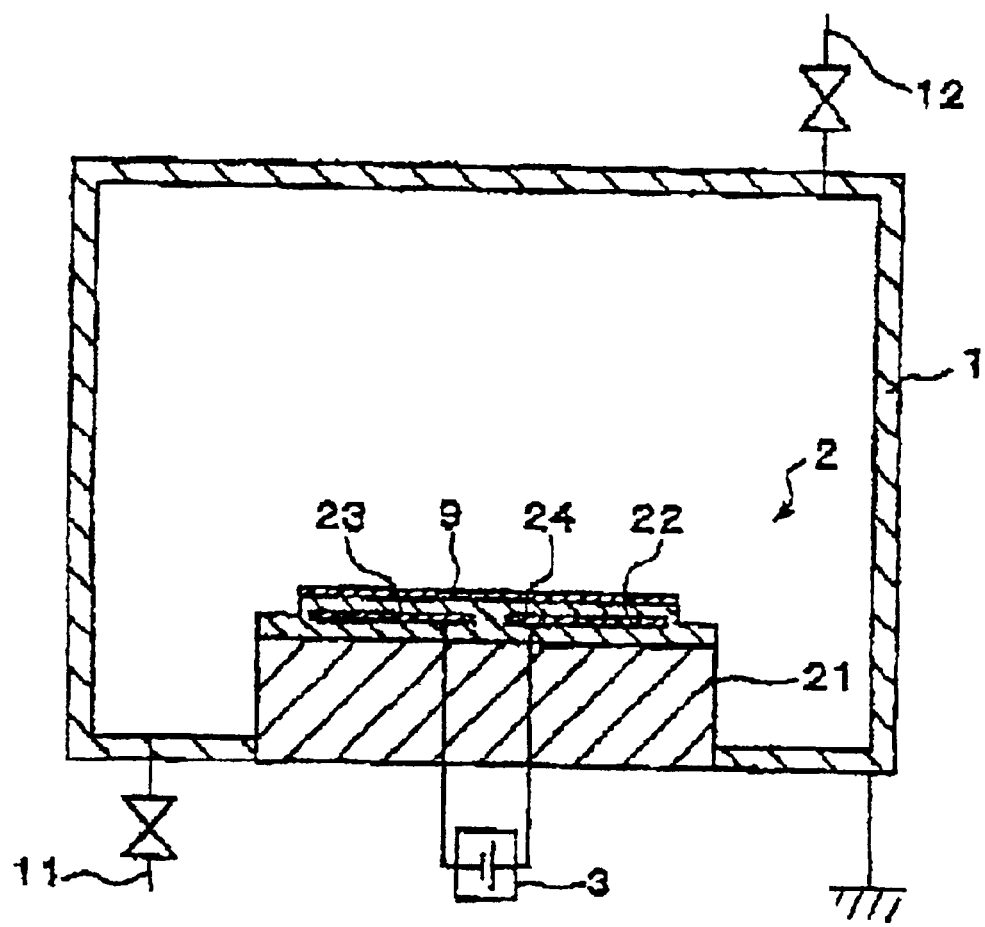

ELECTROSTATIC ATTRACTION MECHANISM, SURFACE PROCESSING METHOD AND SURFACE PROCESSING DEVICE

CROSS-REFERENCE TO RELATED APPLICATIONS

The present application claims the priority of Japanese application no. 2000-205939, filed in Japan on Jul. 6, 2000, the entire contents of which is hereby incorporated herein by reference.

BACKGROUND OF THE INVENTION

1. Field of the Invention

The present invention relates to an attraction mechanism which attracts a plate-shaped object by static electricity, and to surface processing in which prescribed processing is carried out on the surface of a plate-shaped object by holding the plate-shaped object by such an electrostatic attracting mechanism.

2. Description of Related Art

The electrostatic attraction mechanism which attracts a plate-shaped object by static electricity is multipurpose technology which holds the plate-shaped object in position without causing damage thereto. In particular, use can be made of electrostatic chucking technology to hold in a prescribed position a semiconductor device which is to be processed in a surface processing device of any type which is used when manufacturing electronic devices such as LSIs and the like.

FIG. 5 shows an outlined configuration of a conventional surface processing device provided with an electrostatic attraction mechanism. In order to process the plate-shaped object 9 in a prescribed atmosphere, the surface processing device has a processing chamber 1, a pump system 11 which pumps out the interior of the processing chamber 1 and a processing gas feed system 12 which feeds a prescribed processing gas into the interior of the processing chamber 1. The electrostatic attraction mechanism is provided in order to hold the plate-shaped object 9 in a prescribed position inside the processing chamber 1.

The electrostatic attraction mechanism includes an electrostatic attraction stage 2 mounted inside the chamber 1 and an attraction power source 3 which provides the voltage which is used for electrostatic attraction in the electrostatic attraction stage 2. The electrostatic attraction stage 2 includes a stage main body 21, a dielectric block 22 which is fixed to the stage main body 21 and a pair of attraction terminals 23, 24 which are mounted inside the dielectric block 22.

The attraction power source 3 applies direct voltages between the pair of attraction terminals 23, 24. When voltage is applied to the pair of attraction terminals 23, 24, static electricity is induced on the surface by means of dielectric polarization of the dielectric block 22 and the plate-shaped object is electrostatically attracted.

OBJECTS AND SUMMARY

In the surface processing device mentioned above, there is a problem that charged particles may be introduced into the plate-shaped object. In particular, in devices which process by forming plasma inside the processing chamber, as in sputtering devices, plasma CVD devices, plasma etching devices and the like, there is the problem that ions and electrons, of which the plasma is composed, are injected into the plate-shaped object.

The abovementioned problems will be described with reference to a sputtering device. In a sputtering device, sputter discharge is generated inside the processing chamber by establishing an electric field with a target, and producing a prescribed film on the surface of the plate-shaped object by applying to the surface of the plate-shaped object the particles (referred to below as sputtered particles) ejected from the target in the sputtering electrical discharge process. During this sputtering electrical discharge, various charged particles are present in the processing chamber. Specifically, there are the ions and electrons of the processing gas which forms the plasma, the secondary electrons which are ejected from the target along with the sputter particles due to ion injection, sputter particles (ionized sputter particles) ionized in the plasma, and the like.

For example, when an insulator film is deposited beforehand on the surface of the plate-shaped object, a conductive film is deposited on the surface of said insulator film. If charged particles are introduced into the insulator film there is the problem that the voltage which the insulation of the insulator film can withstand before dielectric breakdown is lowered. Then, as a result of a large amount of charged particles accumulating in the insulator film, insulation damage occurs to the insulator film and this is a cause of product defects.

The present invention was devised in order to resolve such problems and it provides a practical configuration which can suppress the introduction of charged particles into a plate-shaped object.

In one embodiment, the present invention includes an electrostatic attraction mechanism that has a dielectric block whose surface is an attraction surface, a pair or a plurality of pairs of attraction terminals which are mounted inside the dielectric block, and an attraction power source which electrostatically attracts a plate-shaped object by inducing static electricity on the attraction surface by applying voltage to the attraction terminals. The attraction power source has a structure such that it can adjust the surface potential of the plate-shaped object by controlling independently the voltages applied to the respective attraction terminals constituting said pair or pairs.

In another aspect of the present invention, while a plate-shaped object is held in a prescribed position inside a processing chamber, prescribed processing is carried out on the surface of said plate-shaped object by electrostatically attracting the plate-shaped object by applying voltage to the pair or plurality of pairs of attraction terminals mounted inside the dielectric block and by inducing static electricity on the attraction surface. Processing is carried out while the surface potential of the plate-shaped object is adjusted by controlling independently the voltages applied to the respective attraction terminals constituting said pair or plurality of pairs of attraction terminals, and the injection of charged particles into the plate-shaped object is suppressed by means of this adjustment.

In another aspect of the present invention, processing may be carried out while specifying a relationship between the applied voltages and the surface potentials by measuring in advance the surface potential of the plate-shaped object while respectively changing the voltages applied to the attraction terminals constituting said pair or plurality of pairs of attraction terminals, and controlling the voltages applied to the attraction terminals in accordance with this relationship.

In another aspect of the present invention, a control part is provided which controls said electrostatic attraction power source in order to suppress the injection of charged particles into the plate-shaped object.

In another aspect of the present invention, the control part has a recording part and a correspondence table comprising data on the relationship between the applied voltages and the surface potentials obtained by measuring in advance the surface potentials of the plate-shaped object while respectively changing the voltages applied to the attraction terminals constituting said pair or plurality of pairs of attraction terminals is recorded in this recording part, and the control part controls said attraction power source with a pattern of applied voltages selected in accordance with this correspondence table.

BRIEF DESCRIPTION OF FIGURES

FIG. 1 illustrates an outlined configuration of an electrostatic attraction mechanism according to an embodiment of the invention of the present application.

FIG. 2 illustrates an outlined configuration of a surface processing device according to a first embodiment of the present invention.

FIG. 3 is a general plan sectional view of an electrostatic attraction stage which is used in an experiment confirming the effects of the suppression of the injection of charged particles by adjusting the surface potential of the plate-shaped object.

FIG. 4 illustrates an approximate configuration of a surface processing device according to a second embodiment of the present invention.

FIG. 5 illustrates an outlined configuration of a conventional surface processing device in which an electrostatic attraction mechanism is provided.

DETAILED DESCRIPTION OF THE PREFERRED EMBODIMENTS

FIG. 1 shows an outlined configuration of an embodiment of the electrostatic attraction mechanism according to the present invention. The electrostatic attraction mechanism shown in FIG. 1 includes an electrostatic attraction stage 2, and an attraction power source 3 which applies an electrostatic attraction voltage to the electrostatic attraction stage 2. The electrostatic attraction stage 2 is configured such that it is composed of a stage main body 21, a dielectric block 22 which is fixed to the stage main body 21, and a pair of attraction terminals 23, 24 which are mounted inside the dielectric block 22.

The stage main body 21 is preferably made of metal such as stainless steel or aluminum or the like. The dielectric block 22 is made of a dielectric material such as alumina or the like. The pair of attraction terminals 23, 24 are plate-shaped items which are mounted in a position parallel to the plate-shaped object 9 to be attracted.

In addition, there are cases in which functions are provided which bring about a thermal exchange between the plate-shaped object 9 and the electrostatic attraction stage 2 for such purposes as controlling the temperature of the plate-shaped object 9. For example, there are cases in which, in order to maintain the temperature of the plate-shaped object 9 within a prescribed range during processing in the surface processing device, a heater is mounted inside the electrostatic attraction stage 2 and negative feedback control of the heater is performed, while a coolant at a prescribed temperature is made to flow in a pipe inside the electrostatic attraction stage 2 and the temperature of the coolant is controlled.

The attraction power source 3 of the subject embodiment of the electrostatic attraction mechanism includes a system which enables the voltages applied to the respective pairs of attraction terminals 23, 24 to be controlled independently. The purpose of this configuration is to control the surface potential of the plate-shaped object 9.

The surface potential of a plate-shaped object on which electrostatic attraction has been performed (more correctly referred to as the potential of the opposite surface from the attraction surface, and referred to below simply as the surface potential) is described, for example, in "Electrostatic Clamping Applied to Semiconductor Plasma Processing", J. Electrochem. Soc., Vol. 140, No. 11, November 1993. In the same publication it is stated that, if the area of the surfaces of the attraction terminals 23, 24 lying opposite the plate-shaped object 9 (referred to below simply as opposite surface) are designated as $S_1$, $S_2$, and the voltages applied to the attraction terminals 23, 24 are designated as $V_1$, $V_2$, the potential $V_W$ of the surface of the plate-shaped object 9 can be obtained from Formula (1) below:

$$V_W=(S_1 \cdot V_1+S_2 \cdot V_2)/(S_1+S_2) \quad \text{Formula (1)}$$

It can be seen from Formula (1) that when the surface areas $S_1$, $S_2$ of the attraction terminals 23, 24 are already known, the surface potential $V_W$ of the plate-shaped object 9 can be freely adjusted by setting $V_1$ and $V_2$ as desired. The present embodiment uses, in view of such points, a system which can control independently the respective voltages applied to the pair of attraction terminals 23, 24 as the attraction power source 3. The configuration of the attraction power source 3 can be formed from a direct current power source circuit which comprises a DC converter which converts an applied AC input power to a direct voltage, and a control circuit which converts the output power of the DC converter into any desired direct voltage using control elements such as transistors or the like.

The surface processing device holds the plate-shaped object 9 by means of the electrostatic attraction mechanism according to the abovementioned embodiment and carries out prescribed processing of the surface on the plate-shaped object 9. Various systems can be used as the surface processing device, but in the description given below a sputtering device will be used as an example.

FIG. 2 shows the outlined configuration of a surface processing device according to the first embodiment of the present invention. The device shown in FIG. 1 is provided with a processing chamber 1 which comprises a pump system 11, a gas feed system 12 which feeds a prescribed gas into the processing chamber 1, a target 41 which is mounted in such a way that a sputtered surface is exposed inside the processing chamber 1, a sputtering power source 42 which provides electrical power to the target 41 for sputtering the target 41, a magnetic unit 43 which is mounted at the rear of the target 41 and an electrostatic attraction mechanism which holds the plate-shaped object 9 in a prescribed position inside the chamber 1, which position is reached by the sputtered particles ejected from the target 41 as a result of the sputtering.

The pump system 11 is configured such that it can pump out the interior of the processing chamber 1 up to a prescribed achievable pressure by means of a vacuum pump of the turbo-molecular type, or the like. The gas feed system 12 is composed of a gas cylinder 123 in which a processing gas such as argon or the like is stored, a valve 121, mass flow rate controller 122 and filter (not shown in the figure) and the like which are mounted on a pipe arrangement connecting the gas cylinder 123 and processing chamber 1.

Target 41 is a plate-shaped element, and its sputtered surface is mounted in such a way that it is parallel with the plate-shaped object 9 on the electrostatic attraction stage 2. Target 41 is connected in an airtight fashion while being interposed between insulating elements 411 which insulate it from the vessel wall of the processing chamber 1 which is at ground potential.

The magnetic unit 43 is provided in order to carry out magnetron sputtering. Magnetron sputtering is a method of sputtering in which a magnetic field is established at right angles to the electrical field and electrons undergo magnetron motion at the time of sputtering discharge. There are the advantages that, because electrons move efficiently through space, the production efficiency of the sputtering electrical discharge becomes high and the sputtering can be carried out at high speed. The magnetic unit 43 is configured from a core magnet 431, a circumferential magnet 432 which surrounds this core magnet 431, and a yoke 433 which connects the core magnet 431 and the circumferential magnet 432. This configuration is formed such that different magnetic poles appear at the surface of the target 41 side of the core magnet 431 and the surface of the target 41 side of the circumferential magnet 432, and circular-segment-shaped magnetic flux lines (as shown in FIG. 2) passing through the target 41 are established. At the lower part of the magnetic flux lines, the magnetic field is approximately at right angles to the electrical field and magnetron electrical discharge is achieved.

The electrostatic attraction stage 2 is mounted so as to cover the opening of the processing chamber 1 in an airtight fashion by means of an insulating element 13. In addition, in the present embodiment, in order to receive the plate-shaped object 9, liftable pins 5 are provided inside the electrostatic attraction stage 2. A plurality of the liftable pins 5 are mounted equally spaced along a circumference which is coaxial with the electrostatic attraction stage 2. The liftable pins 5 can be moved up and down by means of a drive source 51. Furthermore, the device shown in FIG. 2 is provided with a control part 6 which controls the entirety of the device including the attraction power source 3.

As described above, the surface potential of the plate-shaped object 9 can be adjusted as desired by controlling the voltages $V_1$, $V_2$ applied to the pair of attraction terminals 23, 24. For example, when the injection of particles with negative charges such as electrons is suppressed, the voltages $V_1$, $V_2$ are controlled in such a way that the surface potential of the plate-shaped object 9 becomes a prescribed negative potential. In addition, when the injection of positive charges is suppressed, $V_1$, $V_2$ is controlled in such a way that the surface potential of the plate-shaped object 9 becomes a prescribed positive potential.

A description is given below of the results of an experiment which confirms the effects of the suppression of the injection of charged particles by adjusting the surface potential of the plate-shaped object 9 as described above.

FIG. 3 is a general plan sectional view of an electrostatic attraction stage 2 which is used in the experiment which confirms the effects of the suppression of the injection of charged particles by adjusting the surface potential of the plate-shaped object 9. As shown in FIG. 3, a pair of attraction terminals 23, 24 are mounted inside the electrostatic attraction stage 2 used in this experiment, said attraction terminals 23, 24 being semicircular in plan view. The two attraction terminals 23, 24 are arranged concentrically and are disposed so that their straight parts face one another in a parallel arrangement. The pair of attraction terminals 23, 24 are not of the same size, and one is slightly smaller than the other. The surface area of the surface of one of the attraction terminals 23 facing the plate-shaped object 9 will be designated $S_1$ and the surface area of the facing surface of the other attraction terminal 24 will be designated as $S_2$. In the experiment, $S_1=14,000$ mm$^2$ and $S_2=17,000$ mm$^2$. Furthermore, the dielectric block 22 is in the shape of a disc with a diameter of 200 mm and is made of alumina.

In the experiment, a Co film was deposited on the surface of the plate-shaped object 9 comprising a silicon wafer with a diameter of 200 mm, using a Co target 41 with a diameter of 314 mm. Direct current of approximately 400 V and 0.3 kW was applied to the target 41. The amount of process gas fed in was approximately 40 cc/minute, and the pressure inside the processing chamber 1 was set at approximately 10 Pa. In addition, in order to determine the insulation damage to the insulating film as a result of the introduction of charged particles, insulating film composed of silicon oxide is deposited in advance on the surface of the plate-shaped object and divided into 170 parts by means of photolithography.

After an approximately 15 nm Co film was deposited under the abovementioned conditions, the plate-shaped object 9 was removed from the processing chamber 1 and it was determined whether insulation damage occurred by successively applying 7 V to each part of the insulating film. The results of this are shown in Table 1 below. In Table 1, $V_1$ is the voltage applied to one attraction terminal 23, and $V_2$ is the voltage applied to the other attraction terminal 24.

TABLE 1

| Applied voltage | Surface potential of plate-shaped object 9 (calculated value) | Number of parts where insulation damage occurs/total number of parts |
|---|---|---|
| $V_1 = 500$ V<br>$V_2 = -500$ V | −48 V | 3/170 |
| $V_1 = -500$ V<br>$V_2 = 500$ V | 48 V | 170/170 |

As shown in Table 1 above, when 500 V was applied to the smaller attraction terminal 23 and −500 V was applied to the larger attraction terminal 24, insulation damage occurred at only 3 parts, but when −500 V was applied to the smaller attraction terminal 23 and 500 V was applied to the larger attraction terminal 24, insulation damage occurred at all 170 parts. This can be considered to show that when the surface potential of the plate-shaped object 9 becomes a negative potential of approximately −48 V, the injection of electrons is sufficiently suppressed when 500 V is applied to the smaller attraction terminal 23 and −500 V is applied to the larger attraction terminal 24. In contrast, when the surface potential of the plate-shaped object 9 becomes a positive potential of approximately 48 V, the electrons are attracted and injection is promoted when 500 V is applied to the smaller attraction terminal 23 and 500 V is applied to the larger attraction terminal 24. In either case, as shown by these results, the surface potential of the plate-shaped object 9 can be adjusted by changing the voltage applied to the pair of attraction terminals 23, 24, and in this way the injection of charged particles can be suppressed.

Next, a description will be given of both the surface processing according to the first embodiment and the operation of the surface processing device of the first embodiment with the configuration given above.

The plate-shaped object 9 is placed inside the processing chamber 1 through a gate valve (not shown in the figure) and mounted on the electrostatic attraction stage 2 using the liftable pins 5. The attraction power source 3 is operated and the plate-shaped object 9 is subjected to electrostatic attraction on the electrostatic attraction stage 2 as described above. During this time, the voltage applied to the pair of attraction terminals 23, 24 is controlled as previously described, and as a result of this, the surface potential of the plate-shaped object 9 is adjusted to desired values. In addition, according to requirements, a temperature control mechanism (not shown in the figure) which is mounted inside the electrostatic attraction stage 2 is operated and the temperature of the plate-shaped object 9 is adjusted to desired values. Then, the interior of the processing chamber 1 is pumped out with the pressure prescribed in advance and a prescribed flow rate of a prescribed gas is fed in by operating the gas feed system 12 under these conditions.

Next, an electrical field is established through the target 41 by operating the sputter power source 42, and the target 41 is sputtered by generating sputtering electrical discharge. A thin film made of the material of the target 41 is deposited on the plate-shaped object 9 by means of this sputtering. When the thin film has reached a prescribed thickness, the operation of the sputtering power source 42 is stopped and the operation of the gas feed system 12 is stopped. Then, after the interior of the processing chamber 1 has again been evacuated, the plate-shaped object 9 is removed from the chamber 1.

In the configuration of the present embodiment relating to the abovementioned configuration and operation, the injection of charged particles into the film which is formed and into the plate-shaped object 9 is suppressed, so that problems such as insulation damage to the insulating film are reduced, which can contribute to the production of high-quality products.

In the configuration and operation described above, the voltages $V_1$, $V_2$ which are applied to the pair of attraction terminals 23, 24 are preferably controlled within a range which does not impede the electrostatic attraction of the plate-shaped object 9. As electrostatic attraction can be performed by means of an electrical field which is established by means of the pair of attraction terminals 23, 24, problems arise that the electrical field may be weak. In other words, if the difference between the potential of the pair of attraction terminals 23, 24 is small, said potential being generated by means of the applied voltages $V_1$, $V_2$, and sufficient attraction of the plate-shaped object 9 cannot occur. Therefore, it is preferable to control the voltages $V_1$, $V_2$ applied to the pair of attraction terminals 23, 24 within a range in which sufficient attraction of the plate-shaped object 9 can occur.

Next, a description will be given of the surface processing method and device according to a second embodiment.

FIG. 4 shows an outlined configuration of a surface processing device according to a second embodiment of the present invention. In FIG. 4, elements that are similar to those illustrated in FIG. 2 are provided with a same reference numeral, except that the FIG. 4 reference numerals have a prime mark. According to this embodiment, the surface potential of the plate-shaped object 9' is not controlled by controlling the applied voltages $V_1$, $V_2$ on the basis of the surface areas $S_1$, $S_2$ of the facing surfaces which are already known, as in the embodiment described above, but rather the applied voltages $V_1$, $V_2$ are controlled on the basis of data (referred to below as correspondence table) in the table which are correspondingly given for the applied voltages $V_1$, $V_2$ and the surface potential values of the plate-shaped object 9' which have been obtained by actual observation in advance.

The device according to this embodiment is also provided with a control part 6' which controls the entirety of the device. The control part 6' includes a computer, and this computer comprises an input part 61' which inputs data and programs and a recording part 62', such as a memory and hard disk, which records data and programs. The abovementioned first embodiment is also provided with such a control part 6' but in the second embodiment, the correspondence table is recorded by the recording part 62'.

FIG. 2 shows an example of this correspondence table.

TABLE 2

| Applied voltage | Surface potential of substrate (actually observed value) |
|---|---|
| $V_1 = 500$ V<br>$V_2 = -500$ V | 16 V |
| $V_1 = 400$ V<br>$V_2 = -400$ V | 12 V |
| $V_1 = -400$ V<br>$V_2 = 400$ V | -12 V |
| $V_1 = -500$ V<br>$V_2 = 500$ V | -16 V |
| $V_1 = -600$ V<br>$V_2 = 550$ V | -43 V |

Table 2 contains values of the surface potential of the plate-shaped object 9' obtained by actual observation as the applied voltages $V_1$, $V_2$ were changed. As shown in Table 2, by changing the applied voltages $V_1$, $V_2$ different values are also obtained for the surface potential of the plate-shaped object 9'. In Table 2, the surface areas $S_1$, $S_2$ of the facing surfaces are not yet known but it can be approximately inferred by calculations based on Formula (1) that $S_1$=16,000 mm² and $S_2$=15,000 mm².

In the surface processing method according to the second embodiment, the correspondence table shown in Table 2 is recorded by the recording part 62' and the pattern of applied voltages $V_1$, $V_2$ is selected on the basis of the surface potential which is to be provided to the plate-shaped object 9'. The control part 6' controls the attraction power source 3' in such a way that this selected pattern of voltages $V_1$, $V_2$ is applied. Furthermore, the correspondence table is measured in advance before the device operates and input by the input part 61' and stored by the recording part 62'.

The technical significance of the method and device according to the second embodiment are as follows.

In the adjustment of the surface potential of the plate-shaped object 9' by means of the abovementioned Formula (1), it is assumed that the pair of attraction terminals 23', 24' are positioned accurately and that the dielectric constant between the pair of attraction terminals 23', 24' and the plate-shaped object 9' is uniformly distributed.

However, it is difficult to position accurately the attraction terminals 23', 24' in the same plane parallel with the plate-shaped object 9' because of manufacturing variations of the attraction terminals 23', 24' and assembly accuracy of the attraction terminals 23', 24' and the like. In addition, the surface areas $S_1$ and $S_2$ of the facing surfaces are the same and because of manufacturing problems it is difficult to be consistent in the accuracy of the design values. Furthermore, generally there are difficulties in distributing uniformly the dielectric constant of the dielectric block 22' with a high degree of accuracy. In particular, the holes for feeding in the thermal exchange gas between the plate-shaped object 9' and the dielectric block 22', and the holes which position the liftable pins 5' for receiving the plate-shaped object 9' are provided in such a way that they penetrate the dielectric block 22'. In such a case, it is impossible for the relative dielectric constant inside the relative dielectric block 22' to be distributed in a spatially uniform way.

In such a case, even though the surface potential of the plate-shaped object 9' is controlled on the basis of the data of the surface areas $S_1$, $S_2$ of the facing surfaces as in the first embodiment, the surface potential which is actually generated on the plate-shaped object 9' deviates from the calculated values. For this reason, the effect of suppressing the injection of charged particles cannot be obtained in accordance with expectations. In such cases, the surface potential of the plate-shaped object 9' has been measured in advance while changing the applied voltages $V_1$ and $V_2$, and obtained from the corresponding table as in the present embodiment, and the pattern of applied voltages $V_1$, $V_2$ is selected in accordance with the correspondence table. For this reason, the effect of the suppression of the injection of charged particles is obtained in accordance with expectations.

In the description of the embodiments given above, in the cases described the charged particles whose injection has been suppressed have been entirely electrons, but cases with positive ions and negative ions can be embodied in the same way. In the case of positive ions, the surface potential of the plate-shaped object 9 is controlled in such a way that it assumes a prescribed positive value, and in the case of negative ions it is controlled in such a way that it assumes a prescribed negative value.

There may also be embodiments of the present invention in which the pair or plurality of pairs of attraction terminals are not parallel with the plate-shaped object 9. In such cases there may be embodiments in which a formula which is more complicated than Formula (1) must be used. In addition, in cases where the formula is complicated, it is desirable to obtain a correspondence table by measuring the surface potential of the plate-shaped object 9 in advance as in the second embodiment.

In addition, in the embodiments given above, the attraction terminals 23, 24 were configured as a pair of terminals, in other words were of the bi-terminal type, but a multi-terminal configuration in which a plurality of pairs of attraction terminals are provided is also possible. In such a case, it is also possible freely to adjust the surface potential of the plate-shaped object 9 by controlling the voltage applied to the attraction terminals in fundamentally the same way. Furthermore, in the case of a multi-terminal configuration, it is not necessary to perform independent control of all the respective voltages applied to the attraction terminals. It is possible to independently control the voltage applied to one respective group among the pairs which make up the mechanism and the voltage applied to another respective group.

In the embodiments above, sputtering was used as an example of surface processing but the invention can be embodied in the same way with other film-forming processes such as chemical vapour deposition (CVD), and to other surface processing methods such as etching, surface oxidization, surface nitridization, ashing processing and the like.

Possible examples of the plate-shaped objects 9 other than semiconductor wafers are substrates for use in flat panel such as liquid crystal displays and plasma displays and the like and substrates for use in magnetic devices such as magnetic heads and the like. In addition, embodiments of the electrostatic attraction mechanism may be used not only for manufacturing processes but also in analysis devices and the like. In other words, they are devices which analyze while performing electrostatic attraction on a plate-shaped object 9. The present invention demonstrates its capabilities if it is necessary to regulate the surface potential of the plate-shaped object to a prescribed value at the time of analysis.

Furthermore, there are also cases in which the plate-shaped object 9 is referred to as a "sheet" depending on its thickness.

As described above, in the present invention, a novel function of adjusting the surface potential of a plate-shaped object on which attraction is performed is applied.

In addition, the surface processing method and device can contribute to the production of high quality products because processing can be carried out while suppressing the injection of charged particles into the plate-shaped object.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. An electrostatic attraction mechanism, comprising:
   a dielectric block having an attraction surface,
   a pair of attraction terminals which are mounted inside the dielectric block and a first of the pair of attraction terminals is larger in size than a second of the pair of attraction terminals, and
   a power source for applying a voltage to each of the attraction terminals to electrostatically attract a plate-shaped object to the dielectric block by inducing static electricity on the attraction surface,
   wherein the voltage applied to each of the terminals can be individually adjusted in order to control a surface potential of the plate shaped object.

2. The electrostatic attraction mechanism of claim 1, wherein a plurality of pairs of attraction terminals are mounted inside the dielectric block.

3. The electrostatic attraction mechanism of claim 2, wherein the voltage applied to each of the plurality of pairs of terminals can be individually adjusted in order to control the surface potential of the plate shaped object.

4. An electrostatic attraction mechanism, comprising:
   a dielectric block having an attraction surface,
   a pair of attraction terminals which are mounted inside the dielectric block, wherein a first of the pair of attraction terminals is larger in size than a second of the pair of attraction terminals,
   means for applying a voltage to each of the attraction terminals to electrostatically attract a plate-shaped object to the dielectric block by inducing static electricity on the attraction surface, and
   means for individually adjusting the voltage applied to each of the terminals in order to control a surface potential of the plate shaped object.

5. The electrostatic attraction mechanism of claim 4, wherein a plurality of pairs of attraction terminals are mounted inside the dielectric block.

6. The electrostatic attraction mechanism of claim 5, wherein the voltage applied to each of the plurality of pairs of terminals can be individually adjusted in order to control the surface potential of the plate shaped object.

7. A surface processing method, comprising the steps of:
   holding a plate-shaped object in a prescribed position inside a processing chamber on an attraction surface of a dielectric block, the dielectric block having a pair of attraction terminals mounted inside the dielectric block,
   electrostatically attracting the plate-shaped object to the dielectric block by applying a voltage to the pair of attraction terminals to induce static electricity on the attraction surface, independently controlling the voltages applied to each of the respective attraction terminals constituting said pair of attraction terminals to adjust a surface potential of the plate-shaped object in order to suppress injection of charged particles into the plate-shaped object, and processing is carried out while the plate-shaped object is attracted to the dielectric block.

8. A surface processing method, comprising the steps of:

holding a plate-shaped object in a prescribed position inside a processing chamber on an attraction surface of a dielectric block, the dielectric block having a pair of attraction terminals mounted inside the dielectric block, electrostatically attracting the plate-shaped object to the dielectric block by applying a voltage to the pair of attraction terminals to induce static electricity on the attraction surface, independently controlling the voltages applied to each of the respective attraction terminals constituting said pair of attraction terminals to adjust a surface potential of the plate-shaped object in order to suppress injection of charged particles into the plate-shaped object, and processing is carried out while the plate-shaped object is attracted to the dielectric block, wherein the controlling step is carried out while determining a relationship between the applied voltages and the surface potential by measuring in advance the surface potential of the plate-shaped object while respectively changing the voltages applied to the attraction terminals, and controlling the voltages applied to the attraction terminals in accordance with this relationship.

9. The electrostatic attraction mechanism of claim 1, wherein the pair of attraction terminals are arranged inside the dielectric block in a substantially coplanar arrangement.

10. An electrostatic attraction mechanism for use in a surface processing device, the surface processing device including a processing chamber in which prescribed processing is carried out on a surface of a plate-shaped object inside the processing chamber, the electrostatic attraction mechanism comprising:

a dielectric block having an attraction surface, a pair of attraction terminals which are mounted inside the dielectric block, wherein a first of the pair of attraction terminals is larger in size than a second of the pair of attraction terminals, and a power source for applying a voltage to each of the attraction terminals to electrostatically attract a plate-shaped object to the dielectric block by inducing static electricity on the attraction surface, wherein the voltage applied to each of the terminals can be individually adjusted in order to control a surface potential of the plate shaped object.

11. The electrostatic attraction mechanism of claim 10, wherein a plurality of pairs of attraction terminals are mounted inside the dielectric block.

12. The electrostatic attraction mechanism of claim 11, wherein the voltage applied to each of the plurality of pairs of terminals can be individually adjusted in order to control the surface potential of the plate shaped object.

13. The electrostatic attraction mechanism of claim 10, wherein the pair of attraction terminals are arranged inside the dielectric block in a substantially coplanar arrangement.

14. The method of claim 7, wherein the pair of attraction terminals are arranged inside the dielectric block in a substantially coplanar arrangement.

15. The method of claim 7, wherein a first of the pair of attraction terminals is larger in size than a second of the pair of attraction terminals.

16. The method of claim 14, wherein a first of the pair of attraction terminals is larger in size than a second of the pair of attraction terminals.

17. An electrostatic attraction mechanism for use in a surface processing device, the surface processing device including a processing chamber in which prescribed processing is carried out on a surface of a plate-shaped object inside the processing chamber, the electrostatic attraction mechanism comprising:

a dielectric block having an attraction surface, a pair of attraction terminals which are mounted inside the dielectric block, and a power source for applying a voltage to each of the attraction terminals to electrostatically attract a plate-shaped object to the dielectric block by inducing static electricity on the attraction surface, wherein the voltage applied to each of the terminals can be individually adjusted in order to control a surface potential of the plate shaped object in order to suppress an injection of charged particles into the plate-shaped object.

18. The electrostatic attraction mechanism of claim 17, wherein said control part has a recording part and a correspondence table comprising data on a relationship between the applied voltages and the surface potential, the correspondence table being obtained by measuring in advance the surface potential of the plate-shaped object while respectively changing the voltages applied to the attraction terminals and recording the respective voltages and surface potential in the recording part, and the control part controls said power source with a pattern of applied voltages selected in accordance with the correspondence table.

19. The electrostatic attraction mechanism of claim 18, further comprising a recording part and a correspondence table comprising data on a relationship between the applied voltages and the surface potential, the correspondence table being obtained by measuring in advance the surface potential of the plate-shaped object while respectively changing the voltages applied to the attraction terminals and recording the respective voltages and surface potential in the recording part, and the adjusting means controls said applying means with a pattern of applied voltages selected in accordance with the correspondence table.

20. An electrostatic attraction mechanism, comprising:

a dielectric block having an attraction surface, a pair of attraction terminals which are mounted inside the dielectric block, and a power source for applying a voltage to each of the attraction terminals to electrostatically attract a plate-shaped object to the dielectric block by inducing static electricity on the attraction surface, wherein the voltage applied to each of the terminals can be individually adjusted in order to control a surface potential of the plate shaped object in order to suppress an injection of charged particles into the plate-shaped object.

21. An electrostatic attraction mechanism, comprising:

a dielectric block having an attraction surface, a pair of attraction terminals which are mounted inside the dielectric block, means for applying a voltage to each of the attraction terminals to electrostatically attract a plate-shaped object to the dielectric block by inducing static electricity on the attraction surface, and means for individually adjusting the voltage applied to each of the terminals in order to control a surface potential of the plate shaped object in order to suppress an injection of charged particles into the plate-shaped object.

* * * * *